United States Patent
Kataeva et al.

(10) Patent No.: US 12,026,608 B2
(45) Date of Patent: Jul. 2, 2024

(54) METHOD FOR ADJUSTING OUTPUT LEVEL OF MULTILAYER NEURAL NETWORK NEURON

(71) Applicant: DENSO CORPORATION, Kariya (JP)

(72) Inventors: Irina Kataeva, Kariya (JP); Shigeki Otsuka, Kariya (JP)

(73) Assignee: DENSO CORPORATION, Kariya (JP)

(*) Notice: Subject to any disclaimer, the term of this patent is extended or adjusted under 35 U.S.C. 154(b) by 1238 days.

(21) Appl. No.: 16/710,296

(22) Filed: Dec. 11, 2019

(65) Prior Publication Data

US 2020/0110991 A1    Apr. 9, 2020

Related U.S. Application Data

(63) Continuation of application No. PCT/JP2018/018298, filed on May 11, 2018.

(30) Foreign Application Priority Data

Jun. 19, 2017  (JP) ................ 2017-119685

(51) Int. Cl.
*G06N 3/06* (2006.01)
*G06N 3/065* (2023.01)
(Continued)

(52) U.S. Cl.
CPC ............ *G06N 3/065* (2023.01); *G06N 3/084* (2013.01); *G06N 5/046* (2013.01); *G06N 20/00* (2019.01); *G11C 11/40* (2013.01); *G11C 11/54* (2013.01)

(58) Field of Classification Search
CPC ........ G06N 5/046; G06N 3/084; G06N 20/00; G06N 3/065
See application file for complete search history.

(56) References Cited

U.S. PATENT DOCUMENTS 10,885,429 B2 * 1/2021 Taha .................. G06N 3/065
2016/0336064 A1 11/2016 Seo et al.
(Continued)

FOREIGN PATENT DOCUMENTS

WO  2016/068953 A   5/2016
WO  2017/010048 A   1/2017
(Continued)

OTHER PUBLICATIONS

Chu, "Neuromorphic Hardware System for Visual Pattern Recognition With Memristor Array and CMOS Neuron", IEEE, 2015 (Year: 2015).*

(Continued)

*Primary Examiner* — Van C Mang
(74) *Attorney, Agent, or Firm* — MASCHOFF BRENNAN

(57) ABSTRACT

A method for adjusting output level of a neuron in a multilayer neural network is provided. The multilayer neural network includes a memristor and an analog processing circuit, causing transmission of the signals between the neurons and the signal processing in the neurons to be performed in an analog region. The method includes an adjustment step that adjusts an output level of the neurons of each of the layers, causing the output value to become lower than a write threshold voltage of the memristor and to fall within a maximum output range set for the analog processing circuit executing the generation of the output value in accordance with the activation function when each of the output values of the neurons of each of the layers becomes highest.

10 Claims, 9 Drawing Sheets

(51) Int. Cl.
*G06N 3/08* (2023.01)
*G06N 3/084* (2023.01)
*G06N 5/046* (2023.01)
*G06N 20/00* (2019.01)
*G11C 11/40* (2006.01)
*G11C 11/54* (2006.01)

(56) References Cited

U.S. PATENT DOCUMENTS

| | | |
|---|---|---|
| 2017/0017877 A1 | 1/2017 | Kataeva et al. |
| 2017/0017879 A1* | 1/2017 | Kataeva ............... G06F 11/0721 |
| 2017/0316828 A1 | 11/2017 | Hu et al. |
| 2018/0174025 A1* | 6/2018 | Jin .......................... G06N 3/065 |
| 2019/0035463 A1 | 1/2019 | Hu et al. |

FOREIGN PATENT DOCUMENTS

| | | |
|---|---|---|
| WO | 2018220957 A1 | 12/2018 |
| WO | 2018235449 A1 | 12/2018 |
| WO | 2019008951 A1 | 1/2019 |

OTHER PUBLICATIONS

A. Krizhevsky et al., "ImagNet Clasification with Deep Convolutional Neural Networks," Advances in Neural Information Processing Systems 25 (NIPS 2012), pp. 1097-1105, 2012.

C. Szegedy et al., "Going deeper with convolutions," arXiv preprint arXiv: 1409.4842, 2014.

K.K. Likharev, CrossNets: Neuromorphic hybrid CMOS/nanoelectronic networks:, Sci. Adv. Mater., vol. 3, pp. 322-331, Jun. 2011.

M. Prezioso et al., "Training and operation of an integrated neuromorphic network based on metal-oxide memristors", Nature, 521 (7550), 61-64, Dec. 2014.

V. Mnih et al., "Human-level control through deep reinforcement learning," Nature, vol. 518, No. 7540, pp. 529-533, 2015.

* cited by examiner

METHOD FOR ADJUSTING OUTPUT LEVEL OF MULTILAYER NEURAL NETWORK NEURON

CROSS REFERENCE OF RELATED APPLICATION

The present application is a continuation application of International Patent Application No. PCT/JP2018/018298 filed on May 11, 2018 which designated the U. S. and claims the benefit of priority from Japanese Patent Application No. 2017-119685 filed on Jun. 19, 2017. The entire disclosures of all of the above applications are incorporated herein by reference.

TECHNICAL FIELD

The present disclosure relates to a method for adjusting output level of a neuron in a multilayer neural network.

BACKGROUND

A multilayer neural network is an information processing mechanism configured to imitate behaviors of human neural networks. This multilayer neural network is typically constituted by input layers each including input neurons for receiving input values and distributing the input values to other neurons, and output layers each including output neurons outputting output values to the outside, and intermediate layers each including intermediate neurons each present between the input neuron and the output neuron.

SUMMARY

The present disclosure describes a method for adjusting output level of a neuron in a multilayer neural network. The multilayer neural network includes: a memristor and an analog processing circuit, causing transmission of the signals between the neurons and the signal processing in the neurons to be performed in an analog region. The method adjusts an output level of the neurons of each of the layers.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
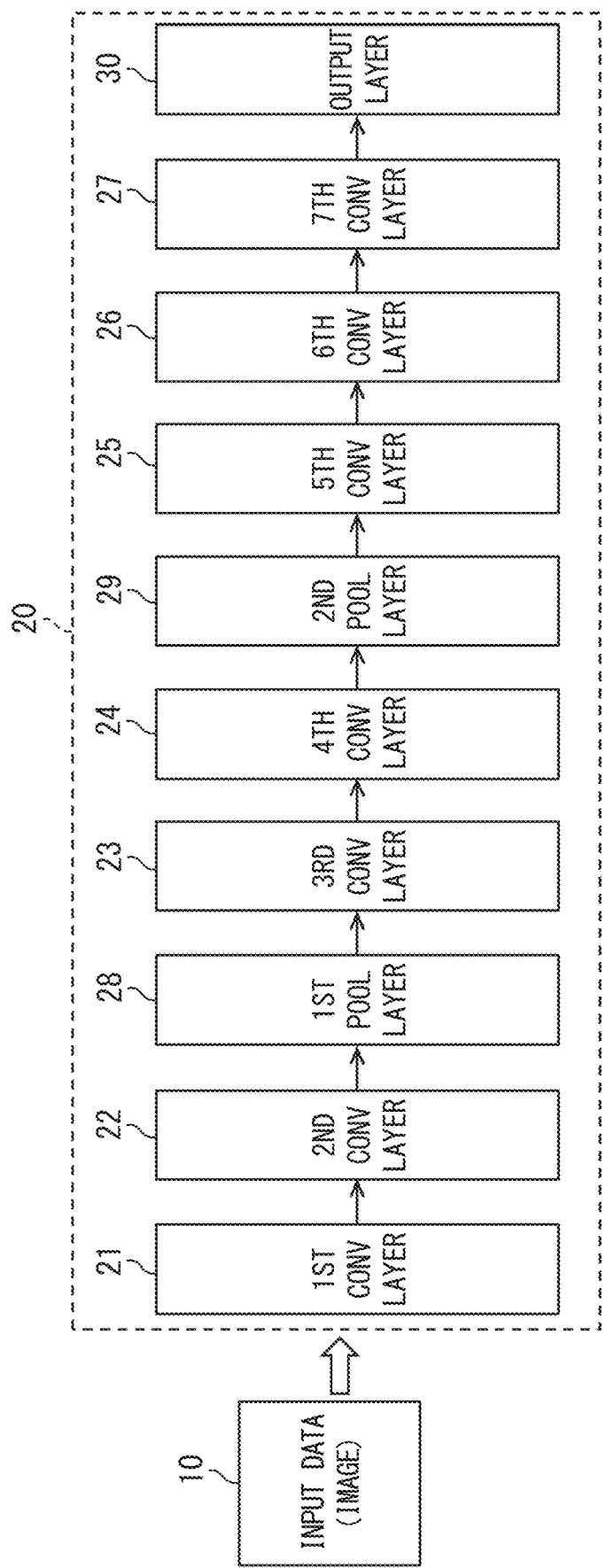
FIG. 1 is a diagram conceptually showing an example of a structure of a multilayer neural network according to an embodiment.

A multilayer neural network is an information processing mechanism configured to imitate behaviors of human neural networks.

Signals flow in one direction from input layers to output layers via intermediate layers. Each of the input neurons transmits the input value to the intermediate neuron without processing the input value. Each of the intermediate neurons and the output neurons calculates a sum of values each obtained by multiplying output values of a plurality of neurons of a previous layer by a positive or negative weight indicating strength of connection, and calculates an output value from the calculated value of the sum using an activation function.

A sigmoid function or a hyperbolic tangent function has been used as the activation function. The sigmoid function is such a function where an output value varies between 0 and 1 along a sigmoid curve with a boundary located at an input value of 0. The hyperbolic tangent function is a function where an output value changes between −1 and 1 along a hyperbola produced by tan h with a boundary located at an input value of 0. When these activation functions are used, a differential coefficient, i.e., a gradient decreases when an input value is a high value requiring a heavy computational load. In this case, the gradient may disappear in a deep layer when learning of a multilayer neural network is performed using a back propagation method.

In recent years, a rectified linear unit (ReLU), and similar functions (e.g., leaky ReLU, maxout) are often used as the activation function. For example, the ReLU is a function defined by max (0, x). These functions are simple, and therefore produce advantages such as fast calculation, no gradient loss, and possible high sparsity. A related art describes that the use of the ReLU may reduce a learning time of a multilayer neural network. A related art also shows that a recognition error rate may be reduced by normalization of outputs of the ReLU, even though the outputs of the ReLU do not saturate in a state of no normalization of inputs.

Various calculations in the multilayer neural network may be digitally performed using a graphics processing unit (GPU). Accordingly, normalization of the outputs of the ReLU can be easily achieved. Meanwhile, the GPU may consume a large amount of power, wherefore development of a dedicated hardware circuit, which is capable of performing calculations of a multilayer neural network with lower power consumption, has been currently in progress. An example of this hardware circuit is a hybrid complementary metal oxide semiconductor (CMOS) circuit which incorporates a resistance random access memory (referred to as a memristor), for example. The resistance random access memory is capable of setting a resistance state which is changeable in accordance with an applied voltage or an energizing current. In the hybrid CMOS circuit, an input value is weighted by a memristor provided at an intersection of a crossbar circuit where an input bar and an output bar intersect with each other. Thereafter, an integrated circuit constituted by CMOS elements is connected to the output bar. This integrated circuit functioning as a neuron executes, in an analog region, addition of weighted input values, and generation of output values from the added input values in accordance with the activation function.

Following situation may occur when generation of output values in accordance with an activation function is performed in an analog region in an integrated circuit (analog processing circuit) constituted by CMOS elements. The situation described below is particularly likely to occur in the case of use of an activation function, like a ReLU, which does not specify an upper limit for output values and therefore has a tendency of producing higher output values of neurons in an upper layer.

An output range as a range allowed for output for a circuit which performs processing as an activation function within an integrated circuit is limited in accordance with a circuit configuration and characteristics of circuit elements of the circuit. Accordingly, when an output value corresponding to the activation function is high, saturation of the output value may be caused under the limitation of the output range. In the case of saturation of the output value, the circuit performing processing as the activation function may not output a correct output value. Conductance of a memristor in a certain layer may change when a voltage equal to or higher than a write threshold is applied to the memristor as a result of input of an input value corresponding to an excessively high output value generated by a neuron in a previous layer. When the conductance of the memristor changes, a desired weight may be difficult to give to the input value.

The present disclosure describes a multilayer neural network neuron output level adjustment method capable of reducing saturation of an output from an analog processing circuit and a change of conductance of a memristor when a multilayer neural network is produced using the memristor and the analog processing circuit.

According to one aspect of the present disclosure, a method for adjusting output level of a neuron in a multilayer neural network may be provided. The multilayer neural network may include: a memristor that includes a variable resistance memory weighting signals to be transmitted, as a synapse; and an analog processing circuit that executes addition of the signals each weighted, and generation of an output value from the signals added in accordance with an activation function, as a signal processing performed in neurons having been layered in a multilayer neural network, causing transmission of the signals between the neurons and the signal processing in the neurons to be performed in an analog region. The method may comprise an adjustment step that adjusts an output level of the neurons of each of the layers, causing the output value to become lower than a write threshold voltage of the memristor and to fall within a maximum output range set for the analog processing circuit executing the generation of the output value in accordance with the activation function when each of the output values of the neurons of each of the layers becomes highest.

According to the present disclosure, saturation of the output value generated in accordance with the activation function can be reduced even in the presence of a limitation of an output range of the analog processing circuit, and a change made by the output value for conductance of the memristor in the subsequent layer can be reduced. Accordingly, it is possible to avoid deterioration of accuracy in recognition, prediction, motion control and the like of the multilayer neural network.

First Embodiment

A multilayer neural network neuron output level adjustment method according to a first embodiment of the present disclosure will be hereinafter described with reference to the drawings. The present embodiment to be described is an example which adopts a so-called convolution neural network as a multilayer neural network and applies the convolution neural network to classification of images as input data into a plurality of categories. The present disclosure is also applicable to an ordinary multilayer neural network constituted by so-called input layers, intermediate layers, and output layers. The multilayer neural network is also applicable to pattern recognition other than image recognition, information compression, motion control, noise removal, time-series prediction and the like, as well as classification of input images described above. A convolution neural network 20 corresponds to an example of the multilayer neural network. Incidentally, a multilayer neural network neuron output level adjustment method may be referred to as a method for adjusting output level of a multilayer neural network neuron.

FIG. 1 conceptually shows an example of a structure of the convolution neural network 20 according to the present embodiment. The convolution neural network 20 basically has such a structure which alternately connects convolution layers and pooling layers. For example, in the case of an example shown in FIG. 1, the convolution neural network 20 includes seven convolution layers constituted by a first convolution layer 21, a second convolution layer 22, a third convolution layer 23, a fourth convolution layer 24, a fifth convolution layer 25, a sixth convolution layer 26 and a seventh convolution layer 27. A first pooling layer 28 is provided between the second convolution layer 22 and the third convolution layer 23. A second pooling layer 29 is provided between the fourth convolution layer 24 and the fifth convolution layer 25.

According to the convolution neural network 20 as described above, the pooling layer is not necessarily connected subsequently to the convolution layer, but may be connected subsequently to a plurality of the connected convolution layers. The numbers of the convolution layers 21 to 27 and the pooling layers 28 to 29 are not limited to the numbers of the example shown in FIG. 1. In general, recognition performance may improve as the numbers of layers of the convolution layers 21 to 27 and the pooling layers 28 to 29 increase.

Each of the first to seventh convolution layers 21 to 27 performs a convolution operation for convoluting input data (images) input to the corresponding convolution layer using filters each having a predetermined size (e.g., 3×3, 5×5) for each of the layers. An image as input data has input values (pixel values) two-dimensionally arranged. The filter convolution operation performed for each of the convolution layers 21 to 27 is basically similar to filter convolution performed by ordinary image processing, i.e., two-dimensional convolution of small-sized images (filters) into input images to blur the images or emphasize edges.

The filter convolution operation performed in each of the first to seventh convolution layers 21 to 27 integrates respective multiplication results obtained by multiplying respective pixel values (weights) of a small-sized image as a filter by respective pixel values in a region of the same size as the size of the filter in an image as input data. When the input data includes a plurality of images, the convolution operation is performed in the same region of each of the plurality of input images using the same filter. Operation results obtained by these convolution operations are further integrated. The integration result thus calculated becomes an output value corresponding to the filter position in each of the convolution layers 21 to 27 by using an activation function such as a ReLU.

The filter is shifted on the image corresponding to input data at a predetermined stride to repeatedly perform the convolution operation described above at each shift position. In this manner, output values corresponding to respective shift positions of the filter are generated throughout the input image in each of the convolution layers 21 to 27. A result of these output values two-dimensionally collected in correspondence with the shift positions of the filter becomes output data produced for each of the convolution layers 21 to 27, and thus becomes input data for the subsequent layer.

In this manner, the output data of each of the convolution layer 21 to 27 is data in the form of an image two-dimensionally arranged, and is generally called a feature map. The same number of feature maps as the number of filters used in each of the convolution layers 21 to 27 are generated. Accordingly, in general, input data including a plurality of input images (feature maps) is input to the second convolution layer 22 and the following layers up to the convolution layer 27. Three images corresponding to RGB are input to the first convolution layer 21 as well when the input image is a color image. Only one image is input to the first convolution layer 21 when the input image is a grayscale image.

In the present embodiment, the size of the filter used for the sixth and seventh convolution layers 26 and 27 is set to 1×1. More specifically, in the sixth and seventh convolution layers 26 and 27, a convolution operation of 1×1 is performed to add pixel values located at the same position in the respective input images and multiplied by a weight of the filter. So-called fully connected layers may be used as the sixth and seventh convolution layers 26 and 27. According to the present embodiment, the convolution layer which performs the convolution operation of 1×1 is adopted as described above to execute, in an analog region, convolution calculation for each of the convolution layers 21 to 27 including the sixth and seventh convolution layers 26 and 27 using a crossbar circuit described below. When the fully connected layers are adopted, the number of input bars excessively increases. In this case, handling by one crossbar circuit becomes difficult. The crossbar circuit will be described in detail below.

According to the present embodiment, a ReLU is used as the activation function as described above. The ReLU is a function defined by max (0, x). When the ReLU which does not have an upper limit value for output values is used as described above, advantages such as quick calculation, no gradient loss, and possible high sparsity can be produced. However, the activation function is not limited to the ReLU, but may be approximate functions similar to the ReLU ($f=\log (1+e^x)$), leaky ReLU (f=max (0.01 x, x)), Parametric ReLU (f=max (ax, x)), or maxout which adopts, as a value of the function, a maximum value in a plurality of linear functions, for example.

The weight of the filter described above is determined by learning. According to the present embodiment, the convolution neural network 20 is temporarily constituted on a computer, and executed by supervised learning. Targets of learning include magnitudes of weights for bias inputs described below, as well as the weights for filters.

Each of the first and second pooling layers 28 and 29 is a layer for increasing consistency for a positional change of a feature appearing within an input image, and reducing an image size to decrease a calculation volume required later by discarding a part of information indicating a position exhibiting high compatibility with the filter in the input image.

Specifically, each of the first and second pooling layers 28 and 29 defines windows of a predetermined size (e.g., 2×2, 3×3) for the input image, and combines a plurality of input values (pixel values) within each of the windows of the input image by averaging the input values (average pooling) or adopting a maximum value of input values in each of the windows (maximum pooling). In this pooling operation, the windows each defining a pooling target range are shifted in the row and column directions to prevent overlapping of the windows. The windows each defining a pooling range may be shifted such that the windows partially overlap with each other. The pooling is performed for each input image (feature map), wherefore the number of input images before and after pooling does not change.

The output layer 30 is configured to output, for each of a plurality of categories to be classified, a probability that an image as the input data 10 belongs to the corresponding category by normalization using a soft max function, for example. Accordingly, the image as the input data 10 can be classified into a plurality of categories by selecting a category corresponding to a highest probability in probabilities output from the output layer 30.

Figure 2:
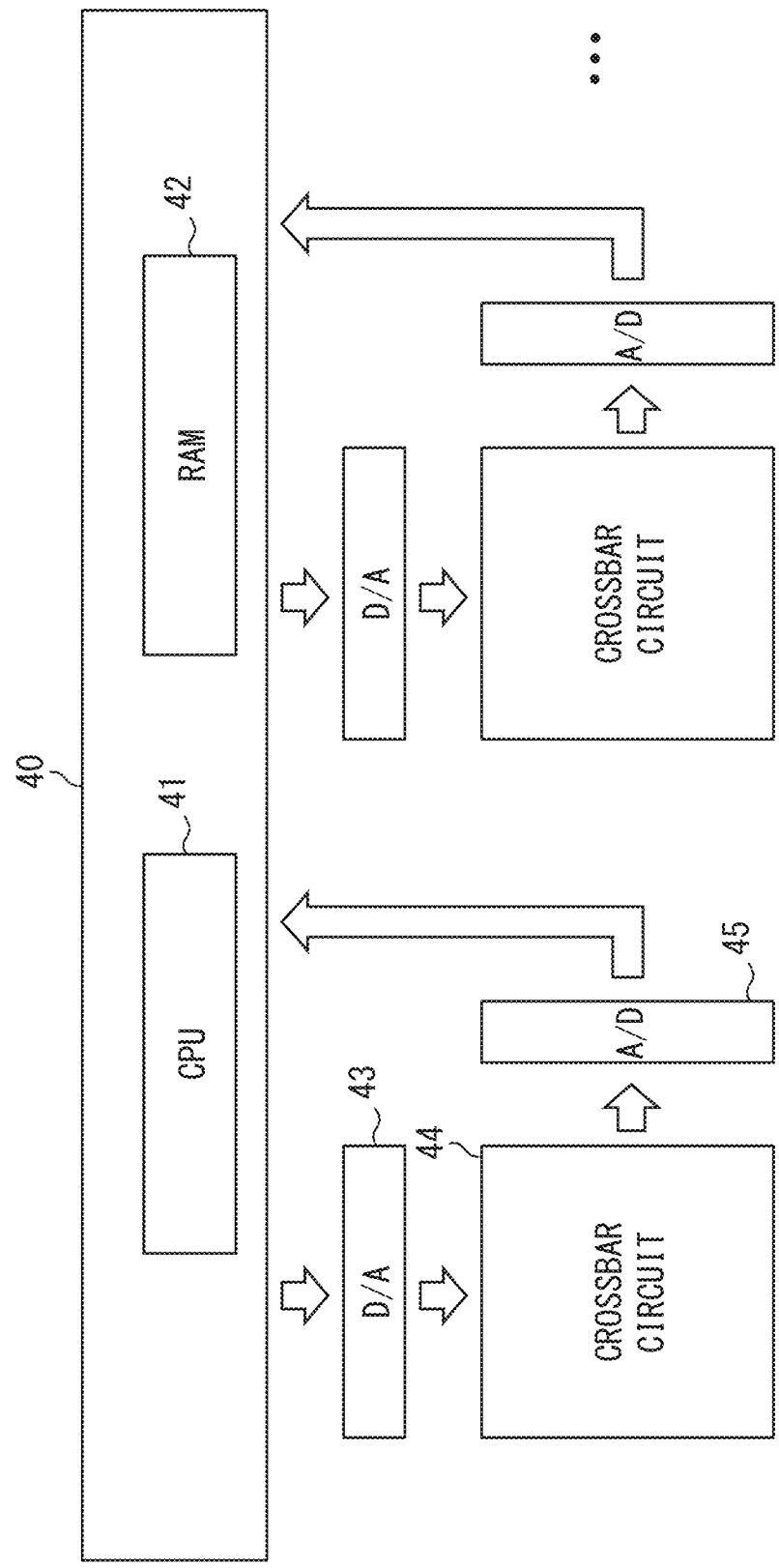
FIG. 2 is a configuration diagram showing a configuration of the multilayer neural network shown in FIG. 1 and embodied using crossbar circuits.

A configuration for embodying the convolution neural network 20 structured as above by using an analog processing circuit constituted by an integrated circuit including crossbar circuits and CMOS elements will be described with reference to FIG. 2. According to the present embodiment, a microcomputer 40, a D/A conversion circuit 43, a crossbar circuit 44, and an A/D conversion circuit 45 are chiefly provided as components for embodying the convolution neural network 20 as shown in FIG. 2. A D/A conversion circuit means a digital-to-analog conversion circuit. An A/D conversion circuit means an analog-to-digital conversion circuit.

The crossbar circuit 44 will be initially described with reference to FIGS. 3 to 5. For example, the crossbar circuit 44 is provided as a hybrid CMOS circuit incorporating memristors as resistance random access memories. The crossbar circuit 44 is an analog processing circuit which performs, in an analog region, processing for weighting input signals using the memristors, adding the weighted input signals which are input to respective neurons for each neuron, and generating an output value from a result of the addition using an activation function.

Figure 3:
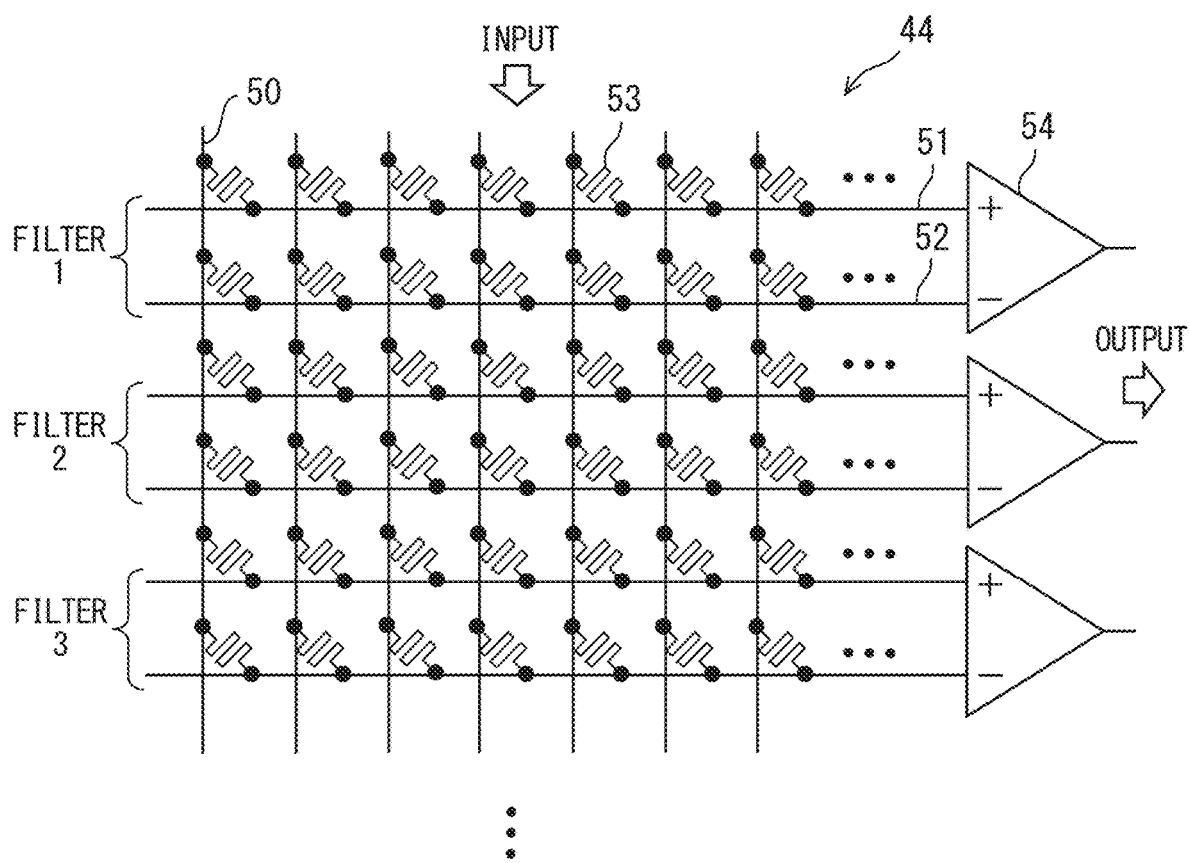
FIG. 3 is a diagram for explaining the crossbar circuit.

As shown in FIG. 3, the crossbar circuit 44 includes a plurality of input bars 50, a plurality of output bars 51 and 52, a plurality of memristors 53 for weighting input signals, and a plurality of differential operational amplifiers 54. Input signals (voltage signals) corresponding to respective pixel values in a region of the same size as the size of the filter described above in an input image are input to the plurality of input bars 50 by the microcomputer 40. The plurality of output bars 51 and 52 are provided in such a manner as to intersect with the plurality of input bars 50.

Figure 4:
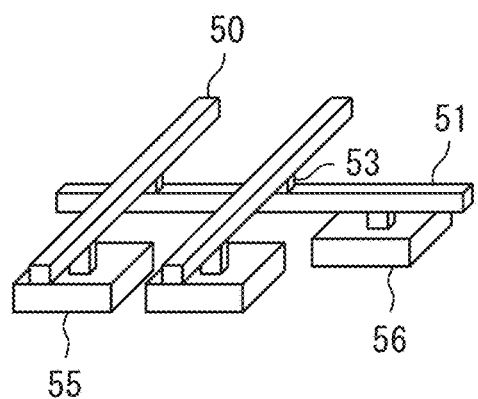
FIG. 4 is a diagram for explaining the crossbar circuit.

As shown in FIG. 4, the respective input bars 50 and output bars 51 and 52 may be provided on a CMOS substrate on which CMOS elements are formed. In this case, a voltage signal corresponding to the pixel value described above is input to the input bar 50 via an input neuron 55 made of a CMOS element. The memristor 53 for weighting an input signal is provided at an intersection of the input bar 50 and the output bar 51. The input bar 50 and the output bar 51 are connected to each other via the memristor 53.

The memristor 53 is a resistance random access memory capable of setting a resistance state which is changeable between a minimum value and a maximum value in accordance with an applied voltage or an energizing current. For example, conductance of the memristor 53 can be raised by applying a negative write voltage using a not-shown voltage application circuit, and can be lowered by applying a positive write voltage. The memristor 53 maintains a set resistance state (conductance) unless a voltage equal to or higher than the positive and negative write voltages is applied. Elements adoptable as the memristor 53 include a Pt/TiO$_2$/Pt metal oxide element, a phase change memory, a magnetic tunnel junction memory, and the like. A resistance random access memory may be referred to as a variable resistance memory.

Figure 5:
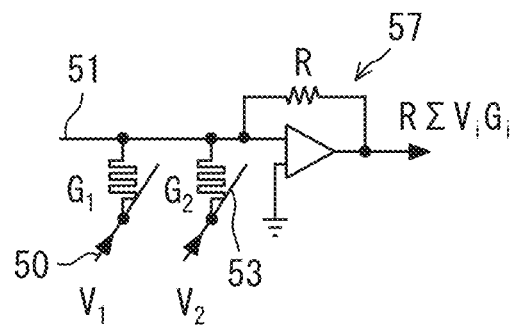
FIG. 5 is a diagram for explaining the crossbar circuit.

FIG. 5 shows an electric circuit corresponding to the configuration shown in FIG. 4. As shown in FIG. 5, an operational amplifier is constituted by CMOS elements which forms an output neuron 56 connected to the output bar 51. In addition, a resistor R is connected between an input and an output of the operational amplifier to constitute an adder 57. Accordingly, as shown in FIG. 5, voltage signals V1 and V2 each input from the input neuron 55 to the input bar 50 are multiplied by conductance values G1 and G2, respectively, by the memristors 53, and are added by the adder 57 connected to the output bar 51. The addition result is multiplied by R by the adder 57. In this manner, the multiplication results of voltage signals V1, V2, and others of the respective input bars 50 and the conductance values G1 and G2 of the memristors 53 are integrated, and further multiplied by R in the output neuron 56 as expressed by following Equation 1.

$$\text{Output voltage of output neuron} = R\Sigma ViGi \quad \text{(Equation 1)}$$

As shown in FIG. 3, each of the output bars 51 is connected to a non-inverting input terminal of the differential operational amplifier 54, and each of the output bars 52 is connected to an inverting input terminal of the differential operational amplifier 54. The differential operational amplifier 54 may be constituted by CMOS elements within a CMOS substrate. FIG. 3 does not show the adder 57 shown in FIG. 5. Moreover, FIG. 3 does not show an activation function processing circuit which performs processing of the activation function described above. In practice, the adder 57 is provided on each of the output bars 51 and 52 on the input side of the differential operational amplifier 54, while the activation function processing circuit is provided on the output side of the differential operational amplifier 54. As described above, the integrated circuit constituted by the CMOS elements includes the adder 57, the differential operational amplifier 54, the activation function processing circuit, and others.

According to the present embodiment, the output bars 51 and 52 are connected to the non-inverting input terminal and the inverting input terminal of the differential operational amplifier 54, respectively. Accordingly, the convolution operation can be performed using not only positive weights but also negative weights as a filter. Specifically, when a certain input signal is multiplied by a positive weight, conductance of the memristor 53 provided between the input bar 50 and the output bar 51 connected to the non-inverting input terminal is set to a value higher by a positive weight to be set than conductance of the memristor 53 provided between the input bar 50 and the output bar 52 connected to the inverting input terminal. Conversely, when a certain input signal is multiplied by a negative weight, conductance of the memristor 53 provided between the input bar 50 and the output bar 52 connected to the inverting input terminal is set to a value higher by a negative weight to be set than conductance of the memristor 53 provided between the input bar 50 and the output bar 51 connected to the non-inverting input terminal.

Accordingly, in the present embodiment, a weight corresponding to each of filters 1, 2, 3, and others used for the corresponding one off the convolution layers 21 to 27 is set for each pair of the two output bars 51 and 52, and for the memristor 53 between the corresponding pair of the output bars 51 and 52 and the input bar 50 as shown in FIG. 3.

The microcomputer 40 includes a central processing unit (CPU) 41, a random access memory (RAM) 42, a read only memory (ROM), and others, and performs various processes in accordance with a program stored in a ROM (corresponding to an example of a non-transitory tangible storage medium), for example. While the process performed for the first convolution layer 21 is described below, the microcomputer 40 performs, in principle, a similar process for each of the other convolution layers 22 to 27.

The microcomputer 40 determines a target region for the filter convolution operation in an image corresponding to the input data 10, and outputs, to the D/A conversion circuit 43, digital signals corresponding to pixel values of respective pixels included in the region. The D/A conversion circuit 43 thus outputs, to the crossbar circuit 44, analog signals (voltage signals) corresponding to the respective pixel values in the target region of the convolution operation.

The microcomputer 40 further executes a process for receiving an output from the A/D conversion circuit 45 at the time of output after completion of the operation process performed by the crossbar circuit 44. At this time, the A/D conversion circuit 45 converts the same number of output values as the number of the filters used in the first convolution layer 21 into digital signals and outputs the digital signals after the output values are processed by the convolution operation and processing using the activation function at a shift position of a certain filter. The microcomputer 40 stores, in the RAM 42, the digital signals output from the A/D conversion circuit 45 while discriminating the plurality of filters.

The microcomputer 40 shifts the target region of the filter convolution operation by a predetermined stride in the input image, outputs, to the D/A conversion circuit 43, digital signals corresponding to the pixel values included in the region after the shift, and performs a process similar to the process described above. This processing is repeated until the shift of the filter is completed in all regions of the input image. As a result, the same number of pieces of digital data indicating feature maps as the number of the filters generated in the first convolution layer 21 are stored in the RAM 42.

An example of technical features of the present embodiment will be described. According to the present embodiment, as described above, the convolution neural network 20 is constituted on a computer, and weights of filters and magnitudes of bias inputs are learned using ordinary gradient descent method, back propagation method, or other methods. The weights for the filters and the weights for the bias inputs in the respective convolution layers 21 to 27 are optimized by this learning.

Levels of output values of the convolution layers 21 to 27 at the end of the learning considerably differ from each other. Particularly, when an activation function which does not have an upper limit for output values, such as a ReLU, is used, neurons in the upper layers close to the output layer tend to output high output values. In this case, a level difference between the output values of the respective convolution layers 21 to 27 easily increases.

Each of FIGS. 6 to 12 shows an example of the level difference between output values from neurons of the corresponding one of the convolution layers 21 to 27. Each of FIGS. 6 to 12 plots maximum output amplitudes of the output neurons 56 belonging to the corresponding one of the convolution layers 21 to 27 when an image is input to the convolution neural network 20. The output level not only differs for each of the convolution layers 21 to 27, but also considerably differs for each of the output neurons 56 belonging to the same layer of the convolution layers 21 to 27. Accordingly, the vertical axis in each of FIGS. 6 to 12 has a logarithmic scale.

Figure 6:
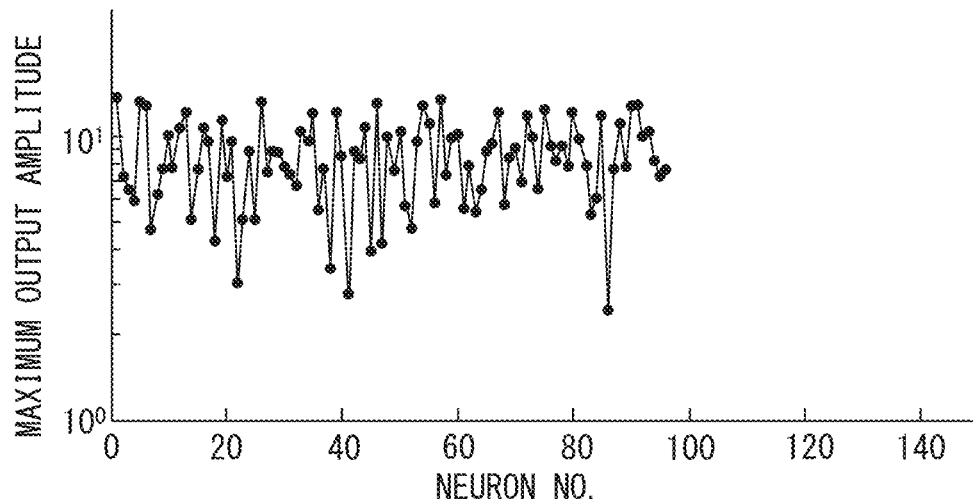
FIG. 6 is a graph showing amplitudes of maximum outputs in output values of respective output neurons in a first convolution layer.
Figure 7:
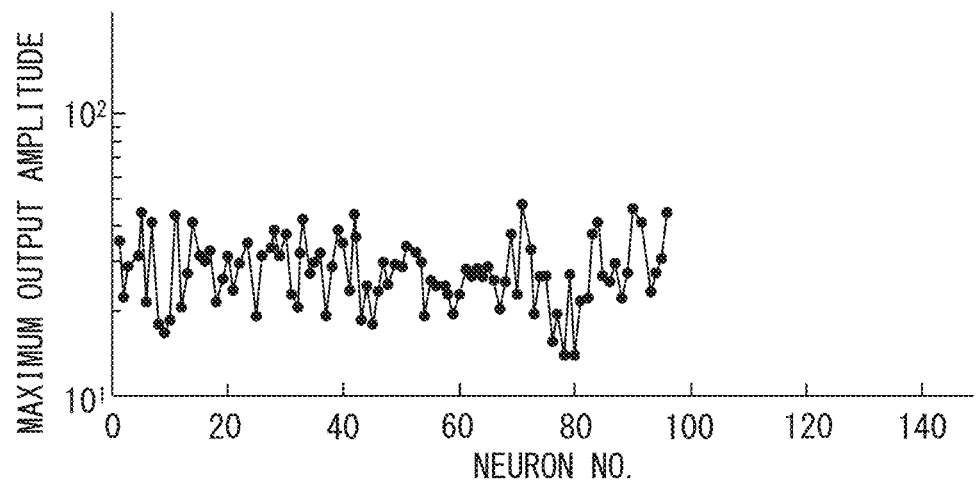
FIG. 7 is a graph showing amplitudes of maximum outputs in output values of respective output neurons in a second convolution layer.

Ninety-six filters are set for each of the first and second convolution layers 21 and 22. Accordingly, each of the first and second convolution layers 21 and 22 has the 96 output neurons 56 corresponding to the 96 filters. As described above, each of the 96 output neurons 56 outputs an output value for each of the shift positions of the filter. FIG. 6 shows amplitudes of maximum outputs in output values from the respective output neurons 56 of the first convolution layer 21, depicting the amplitudes in units of a predetermined output value (voltage value). As shown in FIG. 6, the maximum outputs of the output neurons 56 belonging to the first convolution layer 21 vary in a range of approximately 2.5 to approximately 15. FIG. 7 shows maximum output amplitudes of the output neurons 56 belonging to the second convolution layer 22. As shown in FIG. 7, the maximum outputs of the respective output neurons 56 belonging to the second convolution layer 22 vary in a range of approximately 15 to approximately 50.

Figure 8:
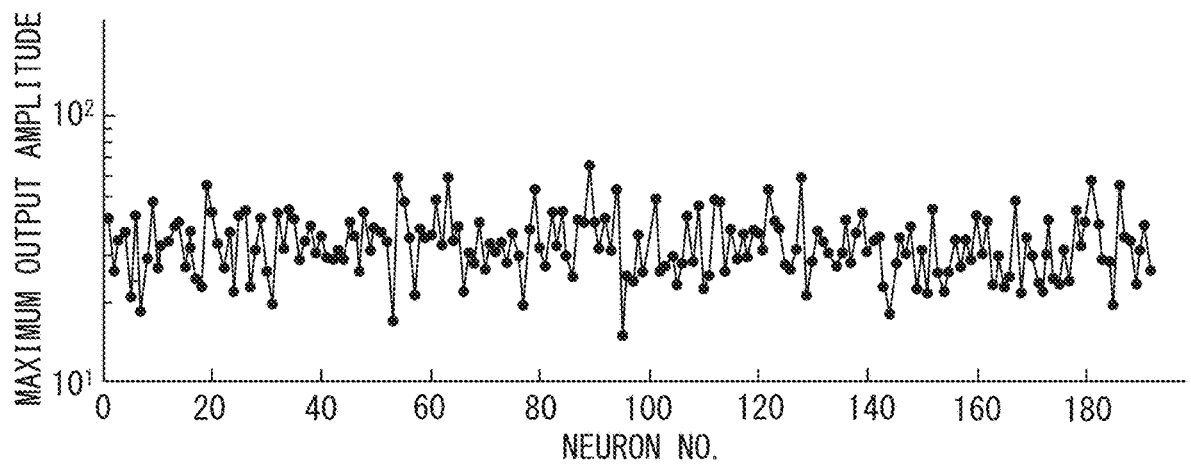
FIG. 8 is a graph showing amplitudes of maximum outputs in output values of respective output neurons in a third convolution layer.
Figure 9:
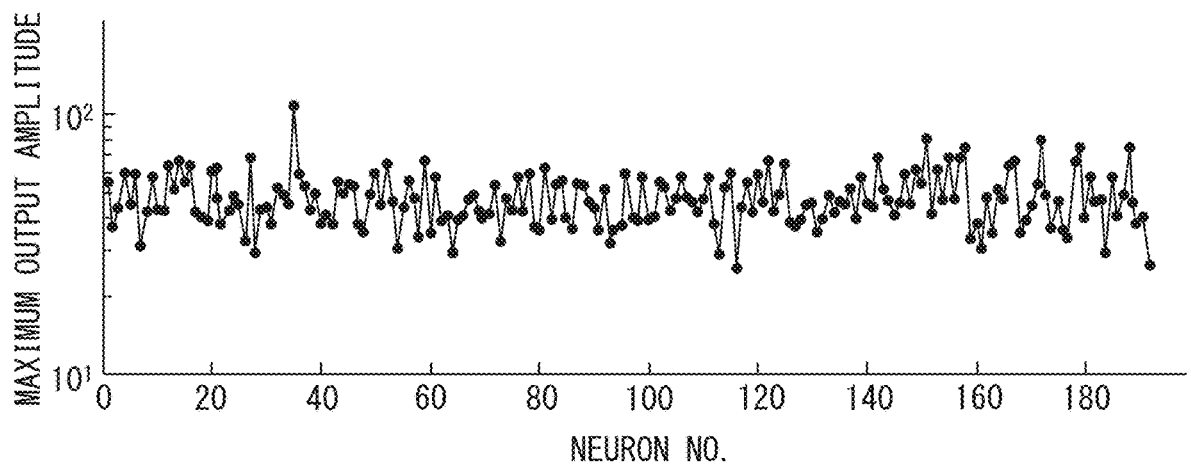
FIG. 9 is a graph showing amplitudes of maximum outputs in output values of respective output neurons in a fourth convolution layer.
Figure 10:
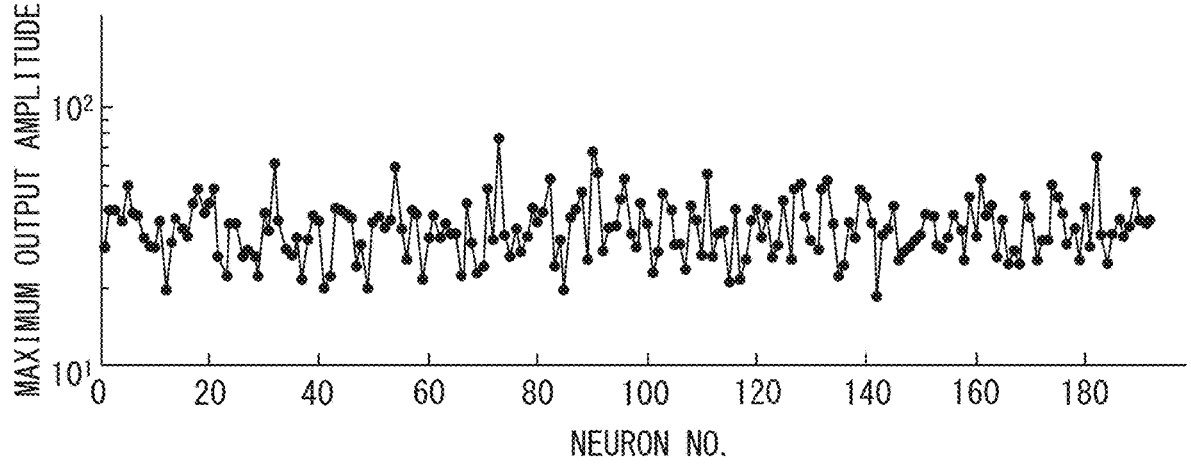
FIG. 10 is a graph showing amplitudes of maximum outputs in output values of respective output neurons in a fifth convolution layer.
Figure 11:
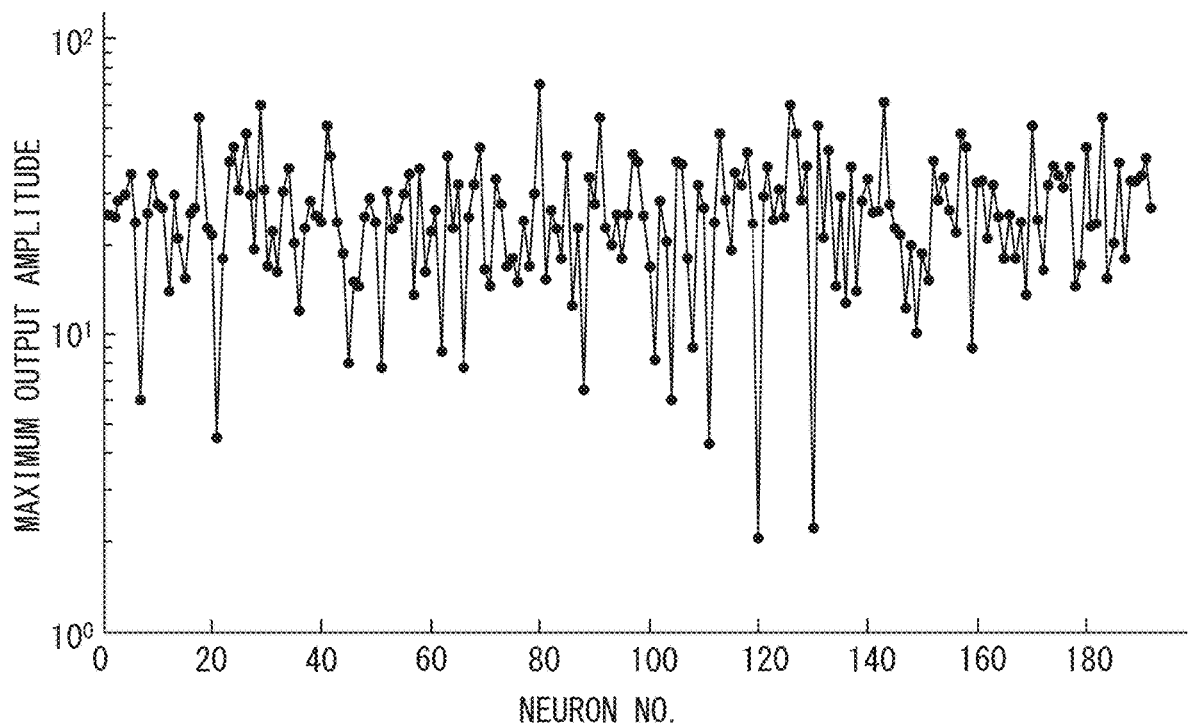
FIG. 11 is a graph showing amplitudes of maximum outputs in output values of respective output neurons in a sixth convolution layer.

One hundred and ninety-two filters are set for each of the third and sixth convolution layers 23 to 26. Accordingly, each of the third and sixth convolution layers 23 and 26 has the 192 output neurons 56. As shown in FIG. 8, the maximum outputs from the respective output neurons 56 belonging to the third convolution layer 23 vary in a range of approximately 15 to approximately 65. As shown in FIG. 9, the maximum outputs from the respective output neurons 56 belonging to the fourth convolution layer 24 vary in a range of approximately 25 to approximately 110. As shown in FIG. 10, the maximum outputs from the respective output neurons 56 belonging to the fifth convolution layer 25 vary in a range of approximately 18 to approximately 80. As shown in FIG. 11, the maximum outputs from the respective output neurons 56 belonging to the sixth convolution layer 26 vary in a range of approximately 2 to approximately 70.

Figure 12:
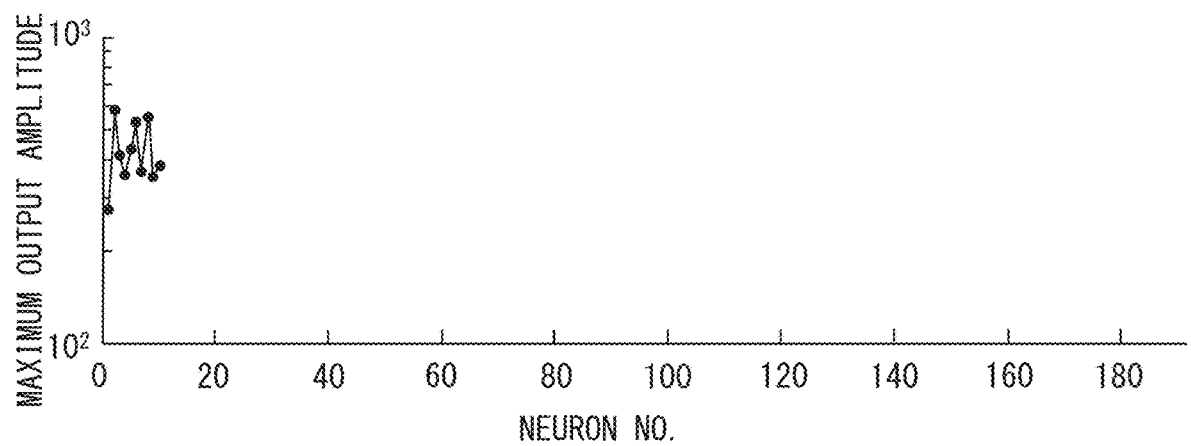
FIG. 12 is a graph showing amplitudes of maximum outputs in output values of respective output neurons in a seventh convolution layer.

The seventh convolution layer 27 has the 10 output neurons 56 in correspondence to the number of categories to be classified. As shown in FIG. 12, the maximum outputs of the respective output neurons 56 belonging to the seventh convolution layer 27 vary in a range of approximately 280 to approximately 600.

As described above, there is a difference of 200 times or more between the respective maximum outputs from the output neurons 56 of the respective convolution layers 21 to 27. There is also a difference of several times or several tens of times between the respective maximum outputs from the output neurons belonging to the same layer of the convolution layers 21 to 27.

According to the present embodiment, as described above, the activation function processing circuit which performs processing as an activation function is provided as a part of the analog processing circuit within the integrated circuit constituted by CMOS elements. In this case, an output range as a range allowed for output for the activation function processing circuit is limited in accordance with a circuit configuration and characteristics of circuit elements of the circuit. Accordingly, in a case where the maximum outputs vary in the ranges described above, the output values may go out of the ranges and become saturated. When the output values are saturated, the activation function processing circuit cannot output correct output values.

Conductance of the memristor 53 of the crossbar circuit 44 may change when a voltage equal to or higher than a write threshold is applied to the memristor 53 as a result of input of an input value corresponding to an excessively high output value generated by the output neuron 56 in the previous layer. When the conductance of the memristor 53 changes, a desired weight may be difficult to give to the input value.

Figure 13:
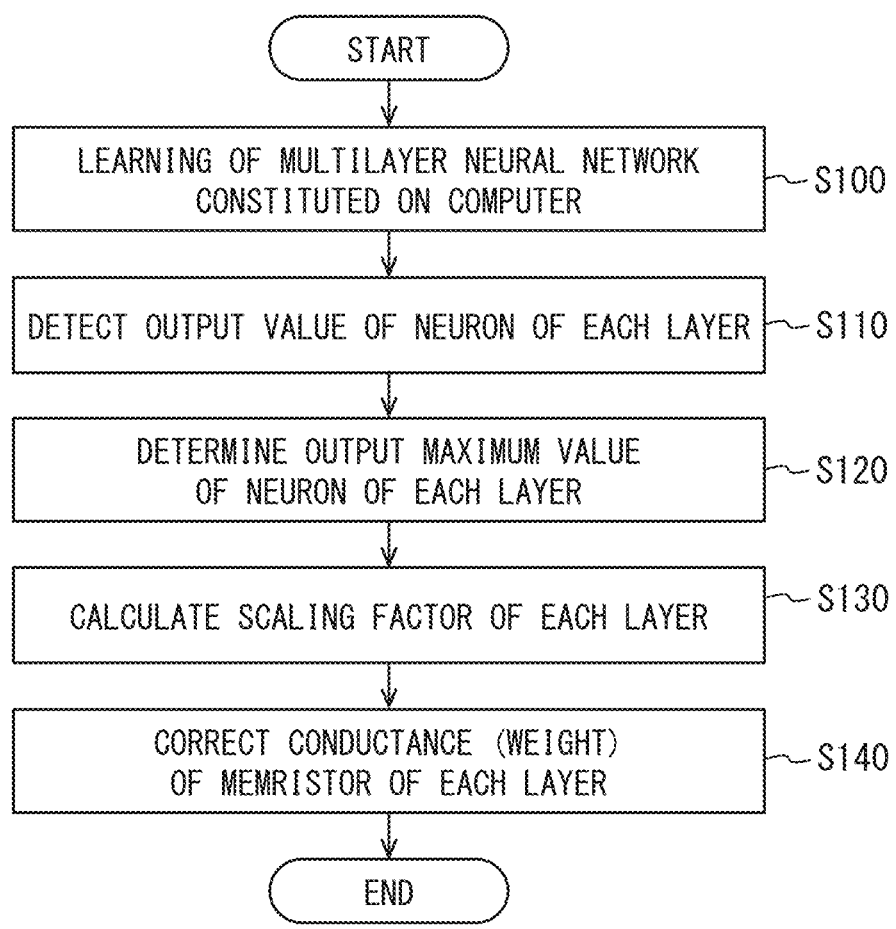
FIG. 13 is a flowchart showing a process for adjusting an output level of a neuron according to a first embodiment.

According to the present embodiment, the learned weights for the filter and for the bias input are not set for the memristor 53 of the crossbar circuit 44 without change, but are corrected such that the output levels of the respective output neurons become appropriate before use of the weights. The neuron output level adjustment method according to the present embodiment will be hereinafter described with reference to a flowchart of FIG. 13. The process shown in the flowchart of FIG. 13 is executed by a computer constituting the convolution neural network 20 as a multilayer neural network.

In S100, a method such as a gradient descent method and a back propagation method is initially applied to the convolution neural network 20 constituted on the computer, and magnitudes of weights for filters and weights for bias inputs of the convolution layers 21 to 27 are learned. According to the present embodiment, the magnitude of the bias input for each layer is set to a predetermined value (e.g., 1).

After completion of the learning, output values from the output neurons 56 of the respective convolution layers 21 to 27 are detected in S110 as output values at the time of input of an image to the convolution neural network 20 which is constituted on the computer and including optimized weights for the filters and the bias inputs. At this time, a plurality of images may be input to detect output values of the output neurons 56 of the respective layers.

In S120, the maximum output in the output values of the output neurons 56 of each of the convolution layers 21 to 27 is selected for each of the output neurons 56. In S120, an output maximum value of the output neurons 56 in each of the convolution layers 21 to 27 is further determined for each of the convolution layers 21 to 27 based on a maximum value in the maximum outputs from the respective output neurons 56 included in each of the respective convolution layers 21 to 27.

In subsequent S130, a scaling factor is calculated for each of the convolution layers 21 to 27 based on the output maximum value determined in S120 and a maximum output range of the activation function processing circuit. The calculation of the scaling factor is sequentially performed from the first convolution layer 21 to the seventh convolution layer 27.

The maximum output range of the activation function processing circuit is set such that the input voltage to the subsequent layer does not become equal to or higher than a write threshold voltage of the memristor 53 (e.g., 0.9 V) even when the output of the activation function processing circuit reaches the upper limit of the maximum output range. For example, the maximum output range of the activation function processing circuit is set in a range lower than 0.5 V, and set to 0.2 V in the present embodiment. As described above, the maximum output range is set to a value lower than 0.5 V with a margin left for the write threshold voltage of memristor 53. Accordingly, the output maximum value of each of convolution layers 21 to 27 does not reach the write threshold voltage of the memristor 53 even when the output maximum value of each of the convolution layers 21 to 27 exceeds the output maximum value determined in S120 in accordance with the input image.

A first layer scaling factor for the first convolution layer 21 is calculated by following Equation 2, for example.

Scaling_factor_layer1=maximum neuron output_layer1/max_range  (Equation 2)

In this manner, the value corresponding to the highest output value in the output values of the output neurons 56 included in the first convolution layer 21 is designated as a first layer output maximum value. This first layer output maximum value is divided by the maximum output range of the activation function processing circuit to calculate the first layer scaling factor.

Subsequently, a second layer scaling factor for the second convolution layer 22 is calculated by following Equation 3, for example.

Scaling_factor_layer2=(maximum neuron output_layer2/max_range)/Scaling_factor_layer1  (Equation 3)

In this manner, a second output maximum value corresponding to the highest output value in the output values of the output neurons 56 included in the second convolution layer 22 is divided by the maximum output range of the activation function processing circuit. A result of this division is further divided by the first layer scaling factor to calculate the second layer scaling factor.

The output value of each of the output neurons 56 of the first convolution layer 21 is corrected (reduced) to a value in an appropriate range using the first layer scaling factor by processing in S140 described below. In this case, the input value input to the second convolution layer 22 is affected by the correction using the first layer scaling factor. Accordingly, the second layer scaling factor is calculated in consideration of the first scaling factor as described above.

Respective scaling factors for the third to seventh convolution layers 23 to 27 are similarly calculated by following Equation 4, for example, in consideration of the scaling factors of the lower layers.

Scaling_factor_layer$N$=(maximum neuron outpt_layer$N$/max_range)/(Scaling_factor_layer1* . . . * Scaling_factor_layer$N$-1)  (Equation 4)

In this manner, the scaling factors of the upper layers of the third to seventh convolution layers 23 to 27 are calculated in cumulative consideration of the scaling factors of the lower layers.

After completion of calculation of the scaling factors for the respective layers, the process proceeds to S140. In S140, the magnitudes of the weights for the filters and the weights for the bias inputs of the convolution layers 21 to 27 learned in S100 are corrected using the scaling factors of the respective layers calculated in S130. Specifically, correction filter weights and correction bias input weights are calculated for each of the convolution layers 21 to 27 by dividing learned original weights for the filters and weights for the bias inputs by the corresponding scaling factors as expressed by following Equations 5 and 6.

$W_{scaled\_layerN} = W_{original\_layerN}/\text{Scaling\_factor\_layer}N$  (Equation 5)

$W\_\text{Bias}_{scaled\_layerN} = W\_\text{Bias}_{original\_layerN}/$
(Scaling_factor_layer$N$*Scaling_factor_layer($N$-1)* . . . * Scaling_factor_layer2*Scaling_factor_layer1)  (Equation 6)

Information concerning the correction filter weights and the correction bias input weights is given to a not-shown conductance setting device. The conductance setting device applies a voltage equal to or higher than the write threshold voltage of the memristor 53 between the input bar 50 and the output bars 51 and 52 of the crossbar circuit 44 of each of the convolution layers 21 to 27 to set conductance corresponding to the correction filter weight and the correction bias input weight to each of the memristors 53.

In the manner described above, the scaling factors of the respective layers are calculated, and the weights for the filters and the weights for the bias inputs of the respective layers are corrected using the calculated scaling factors. Accordingly, the output values of the output neurons 56 of the respective layers fall within the set maximum output range of the analog processing circuit with a higher possibility, and do not exceed the write threshold voltages of the memristors 53.

The ReLU used as the activation function in the present embodiment is a linear function in a positive range. Accordingly, correction of the weights for the filters and the bias inputs using the scaling factors does not adversely affect recognition performance.

Figure 14:
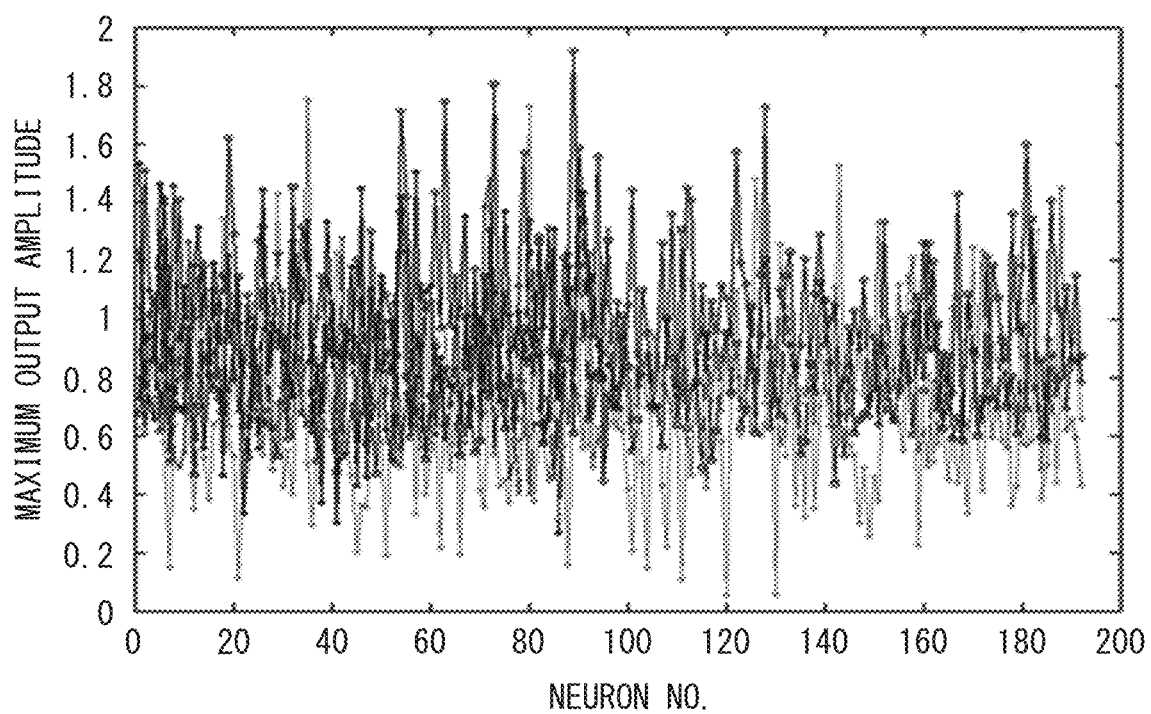
FIG. 14 is a graph showing an example of amplitudes of maximum outputs output from output neurons in respective convolution layers when a correction filter weight and a correction bias input are used.

A graph of FIG. 14 shows a result of examined amplitudes of maximum outputs from the output neurons 56 of the respective convolution layers 21 to 27 when correction filter weights and correction bias input weights are used. FIG. 14 shows the overlapped amplitudes of the maximum outputs from the output neurons 56 of the respective convolution layers 21 to 27.

As understood from FIG. 14, the amplitudes of the outputs from the output neurons 56 of each of the layers fall within a range from 0 to 2, According to the example shown in FIG. 14, the unit of the maximum output amplitudes is determined to correspond to 0.1 V when converted into a voltage value. Accordingly, in the example of FIG. 14, the output values from the output neurons 56 of each layer fall within a range up to 0.2 V after conversion into voltage.

In the first embodiment described above, the output maximum value of each of the convolution layers 21 to 27 is calculated as a value corresponding to the maximum output value in the output values of the output neurons 56 included in the respective convolution layers 21 to 27. However, the method of calculating the output maximum value of the respective convolution layers 21 to 27 is not limited to this method.

For example, the output maximum values of the respective convolution layers 21 to 27 may be calculated by adding $M\alpha$ (M: real number, $\alpha$: standard deviation) to an average value obtained by averaging maximum values of respective output values of the plurality of output neurons 56 included in each of the layers as expressed in following Equation 7.

The $N$-th layer output maximum value=mean value of maximum neuron outputs_layer$N$+$M\sigma$  (Equation 7)

The magnitude of the standard deviation a can be calculated from a distribution of maximum outputs of the respective output neurons 56 when one or a plurality of images are input to the convolution neural network 20. The standard deviation Q may be calculated for each layer. The real number M multiplied by the standard deviation a may be selected in a range from 3 to 6, for example, to secure a safe margin.

Even when the foregoing calculation method is adopted, appropriate output maximum values of the respective convolution layers 21 to 27 can be calculated.

Second Embodiment

A multilayer neural network neuron output level adjustment method according to a second embodiment of the present disclosure will be next described.

In the first embodiment described above, weights for filters and magnitudes of bias inputs are initially learned for the convolution neural network 20 constituted on the computer. For the convolution neural network 20 after the learning, output values of the output neurons 56 of each of the convolution layers 21 to 27 are detected, and scaling factors for adjusting output levels of the respective output neurons 56 are calculated based on the detected output values.

The learning of the convolution neural network 20 may be performed by a configuration embodied using the crossbar circuit 44. According to the present embodiment, learning is performed for the convolution neural network 20 embodied using the crossbar circuit 44, and adjustment of the output levels of the output neurons 56 of each of the convolution layers 21 to 27 is also made at the time of execution of the learning.

An outline of learning of the convolution neural network 20 embodied using the crossbar circuit 44 will be hereinafter described.

Teaching data (e.g., MNIST data set of handwritten numbers from 0 to 9) is input to the convolution neural network 20 embodied using the crossbar circuit 44. Thereafter, an analog output voltage y output from the convolution neural network 20 is measured. A difference e=target−y, which is a difference produced between a target analog output voltage target and the actual analog output voltage y and corresponding to a false recognition rate (e.g., false recognition rate of MNIST category classification), is calculated using the analog output voltage y. This processing corresponds to forward propagation of signals in the convolution neural network 20.

Subsequently, a voltage signal corresponding to the false recognition rate e=target−y is input from the output side of the convolution neural network 20, and an output voltage output from the input side of the convolution neural network 20 is measured. This processing corresponds to back propagation of signals within the convolution neural network 20. However, voltage signals in the back propagation propagate while bypassing the activation function processing circuit in the analog processing circuit along with conversion by a differential activation function processing circuit. The differential activation function processing circuit is a circuit embodying a function obtained by differentiating the activation function.

A conductance update amount is calculated for each of conductance values of the respective memristors 53 of the crossbar circuit 44 based on the false recognition rate obtained by the forward propagation and the output voltage obtained by the back propagation. Furthermore, a write voltage to be applied to each of the memristors 53 for achieving the conductance update amount is calculated. A method for calculating the forward propagation and the back propagation in the learning of the foregoing neural network, and the update amount of conductance based on these propagations is described in detail in, for example, International Patent Application No. WO 2017/010048 A filed on Jun. 22, 2016, which is herein by reference. Further description will not be repeated.

As described above, the conductance values (weights) of the memristors 53 of the crossbar circuit 44 are changed by learning when learning is performed in the convolution neural network 20 embodied using the crossbar circuit 44. In this case, the conductance values of the respective memristors 53 cannot be corrected to adjust the output levels of the output neurons 56 of the respective convolution layers 21 to 27 as in the first embodiment.

According to the present embodiment, therefore, the output levels of the output neurons 56 of the respective layers are adjusted using the adder 57 shown in FIG. 5 and the differential operational amplifier 54 shown in FIG. 3 provided within the analog processing circuit. The neuron output level adjustment method according to the present embodiment will be described with reference to a flowchart of FIG. 15. The process shown in the flowchart of FIG. 15 is executed by the microcomputer 40.

In the following description, an example which uses the adder 57 shown in FIG. 5 to adjust the output levels of the output neurons 56 in the respective layers will be described. In this case, a feedback resistor R of the adder 57 is constituted by a memristor, for example. The magnitude of the feedback resistor R is changeable.

Figure 15:
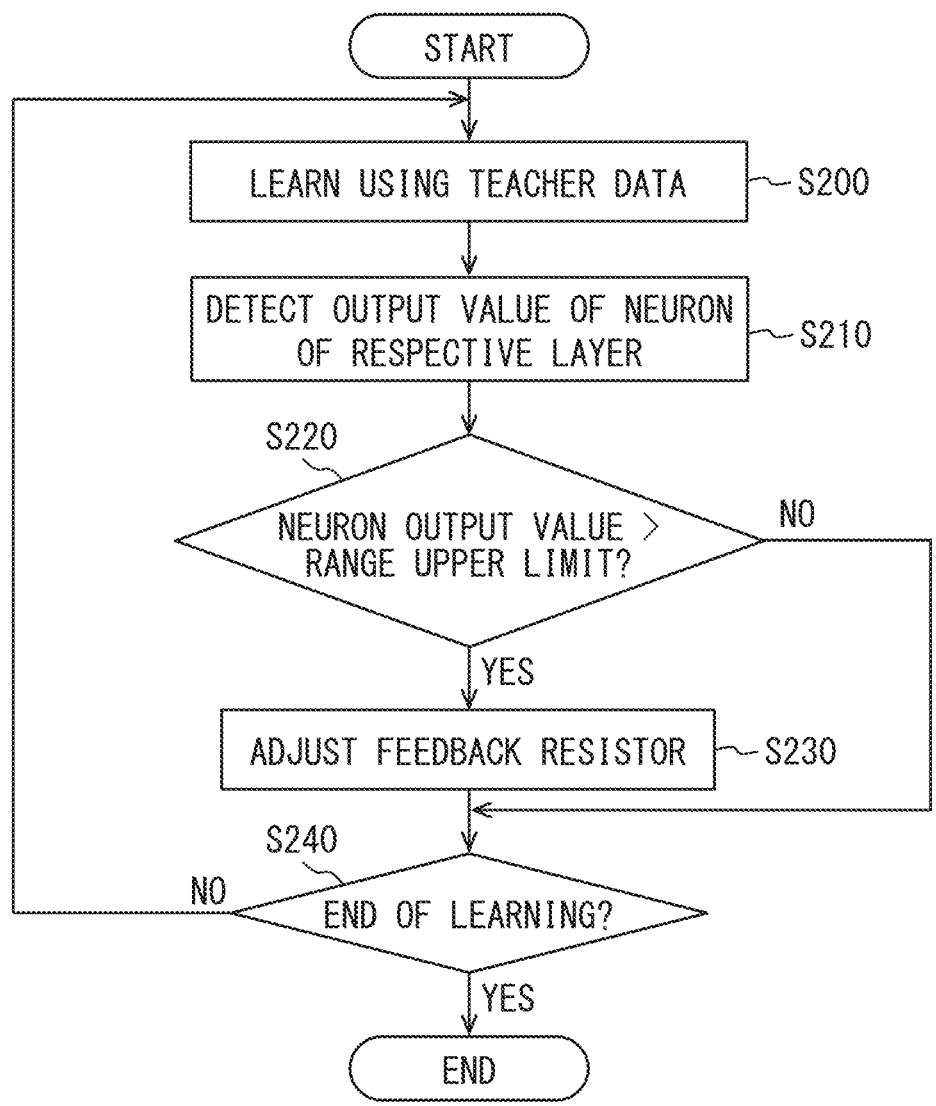
FIG. 15 is a flowchart showing a process for adjusting an output level of a neuron according to a second embodiment.

In S200 of the flowchart of FIG. 15, learning using the teaching data is performed. In subsequent S210, output values of the output neurons 56 of the respective convolution layers 21 to 27 are detected.

In S220, it is determined whether each of the detected output values of the output neurons 56 (i.e., the output values of the activation processing circuit) exceeds an upper limit determined for a maximum output range of the analog processing circuit and set below the write threshold voltage of the memristor 53. When it is determined that the output value of any one of the output neurons 56 exceeds the upper limit of the maximum output range of the analog processing circuit, the process proceeds to the processing of S230, and adjusts (decreases) the magnitude of the feedback resistor R of the adder 57 such that the output value of the corresponding output neuron 56 becomes lower than the range upper limit. In subsequent S240, it is determined whether the learning has been completed. When it is determined that the learning has not been completed, the processing from S200 will be repeated.

According to the present embodiment, the magnitude of the feedback resistor R of the adder 57 is adjusted such that the output value from each of the output neurons 56 becomes lower than the range upper limit. Accordingly, when learning is completed, the output value from each of the output neurons 56 falls within the set maximum output range of the analog processing circuit with a high possibility, and it is possible to prevent from exceeding the write threshold voltage of the memristor.

It is preferable that adjustment of the feedback resistor R is performed in an order from the output neurons 56 of the lower layer close to the input layer of the convolution neural network 20 to the output neurons 56 of the upper layer close to the output layer as in the first embodiment described above. In this case, the output levels of the output neurons 56 of the upper layer are adjustable in consideration of the adjustment result of the output levels of the output neurons 56 of the lower layer.

When the output levels are adjusted in the order from the output neurons 56 of the lower layer to the output neurons 56 of the upper layer as described above, the magnitude of the feedback resistor R may be individually adjusted for each of the output neurons 56 belonging to the same layer. For example, the highest output value may be selected from the output values exceeding the range upper limit in the output values of the plurality of output neurons 56 belonging to the same layer. The magnitudes of the feedback resistors R of the plurality of output neurons belonging to the same layer may be collectively adjusted by an amount necessary for adjusting the highest output value to a value lower than the upper limit of the maximum output range.

Moreover, the magnitudes of the feedback resistors R included in the analog processing circuits and corresponding to the output neurons 56 of all the layers may be collectively adjusted.

Furthermore, a feedback resistor R constituted by a memristor may be connected between an inverting input terminal and an output terminal of the differential operational amplifier 54 shown in FIG. 3, instead of the feedback resistor R of the adder 57, and the feedback resistor R of the differential operational amplifier 54 may be designated as an adjustment target. In addition, for expanding the adjustment range, both the feedback resistor R of the adder 57 and the feedback resistor R of the differential operational amplifier 54 may be designated as adjustment targets.

S110 to S140 and S200 to S240 correspond to an example of an adjustment step or an adjustment section. S110 and S210 correspond to an example of a detection step or a detection section. S120 and S130 correspond to an example of a calculation step or a calculation section. S140 corresponds to an example of a correction step or a correction section. S220 corresponds to an example of a determination step or a determination section. S230 corresponds to an example of a change step or a change section. The adjustment step may include a first adjustment step and a second adjustment step.

According to another aspect of the present disclosure, the adjustment step may be executed for a multilayer neural network constituted on a computer as an example of the adjustment step. The adjustment step may include: a detection step that detects output values of neurons of respective layers; a calculation step that calculates scaling factors for each of the layers based on the output maximum value of the neurons of the respective layers determined from the output values detected in the detection step for the neurons of the respective layers, and based on the maximum output range of the analog processing circuit that executes generation of output values in accordance with the activation function, the maximum output range of the analog processing circuit being set such that each of the output values of the respective layers becomes lower than a write threshold voltage of a memristor; and a correction step that corrects conductance of the corresponding memristor in accordance with the scaling factor calculated in the calculation step for each of the layers. In this manner, the conductance corrected by the correction step can be actually set for the memristor.

According to this configuration, the scaling factor is calculated, and the conductance (weight) of the memristor is corrected using the calculated scaling factor in the case of execution of the adjustment step for the multilayer neural network constituted on the computer. Accordingly, the output levels of the neurons of the respective layers can be appropriately adjusted, More specifically, the scaling factor is calculated for each of the layers based on the maximum output value of the neurons of the corresponding layer and the maximum output range of the analog processing circuit. The maximum output range of the analog processing circuit is set such that each of the output values of the neurons of the respective layers always becomes lower than the write threshold voltage of the memristor. Accordingly, by correcting the conductance of the memristor using the scaling factor, the output value of each of the neurons falls within the range of the set maximum output range of the analog processing circuit with a high possibility, and does not exceed the write threshold voltage of the memristor.

Furthermore, according to further aspect of the present disclosure, another example of the adjustment step may be performed at the time when the learning is performed in the multilayer neural network constituted using the memristors and the analog processing circuit. The analog processing circuit may include an operational amplifier, and a feedback resistor which connects an output of the operational amplifier and an inverting input terminal, and determines a degree of amplification using the operational amplifier. The feedback resistor may be a memristor. The adjustment step may include: a detection step that detects output values of neurons of respective layers; a determination step that determines whether each of output values of the neurons of the respective layers detected in the detection step exceeds a predetermined range upper limit determined based on a write threshold voltage of a memristor; and a change step that changes a resistance value of a memristor as a feedback resistor in the analog processing circuit corresponding to the neuron having an output value exceeding the range upper limit to lower the output value of the neuron to a value equal to or lower than the range upper limit.

As described above, when the adjustment step is also executed at the time of execution of learning in the multilayer neural network constituted using the memristors and the analog processing circuit, the conductance (weight) of the memristor is changed by the learning. In this case, the conductance of the memristor cannot be corrected in the adjustment step. Accordingly, the operational amplifier, and the feedback resistor constituted by the memristor are equipped in the analog processing circuit. The resistance value of the memristor as the feedback resistor is changed in the analog processing circuit corresponding to the neuron having the output value exceeding the range upper limit. Even in this case, the output value of each of the output neurons falls within the set maximum output range of the analog processing circuit with a high possibility, and does not exceed the write threshold voltage of the memristor.

It is noted that a flowchart or the processing of the flowchart in the present application includes multiple steps (also referred to as sections), each of which is represented, for instance, as S100. Further, each step can be divided into several sub-steps while several steps can be combined into a single step.

While various embodiments, configurations, and aspects of method for adjusting output level of multilayer neural network neuron according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A method for adjusting output level of a neuron in a multilayer neural network, the multilayer neural network including:
a memristor that includes a variable resistance memory weighting signals to be transmitted, as a synapse; and
an analog processing circuit that executes addition of the signals each weighted, and generation of an output value from the signals added in accordance with an activation function, as a signal processing performed in neurons having been layered in a multilayer neural network,
causing transmission of the signals between the neurons and the signal processing in the neurons to be performed in an analog region,
the method comprising:
an adjustment step that adjusts an output level of the neurons of each of the layers, causing the output value of the neurons of each of the layers to become lower than a write threshold voltage of the memristor when each of the output values of the neurons of each of the layers becomes highest among output values taken by the neurons of each of the layers and causing the output value of the neurons of each of the layers to fall within a maximum output range set for the analog processing circuit executing the generation of the output value in accordance with the activation function when each of the output values of the neurons of each of the layers becomes highest among output values taken by the neurons of each of the layers, wherein
the activation function does not have an upper limit regarding the output value;
the adjustment step is executed on a multilayer neural network constructed on a computer;
the adjustment step includes
a detection step that detects the output values of the neurons of each of the layers,
a calculation step that calculates scaling factors for the layers based on an output maximum value of the neurons of each of the layers determined from the output values detected in the detection step for the neurons of each of the layers, and based on a maximum output range of the analog processing circuit executing the generation of output values in accordance with the activation function, the maximum output range of the analog processing circuit being set and each of the output values of the neurons of each of the layers becoming lower than the write threshold voltage of the memristor, and
a correction step that corrects conductance of the corresponding memristor in accordance with each of the scaling factors; and
the conductance corrected in the correction step is actually set for the memristor.

2. The method according to claim 1, wherein:
the calculation step calculates the scaling factor in an order from a neuron in a lower layer close to an input layer of the multilayer neural network to a neuron in an upper layer close to an output layer; and
the scaling factor for the neuron in the upper layer is calculated in cumulative consideration of the scaling factor of the neuron in the lower layer than the scaling factor of the neuron in the upper layer.

3. The method according to claim 1, wherein:
the calculation step determines, for each of the layers, the output maximum value of the neurons of each of the layers based on a maximum value among the output values of the neurons included in the corresponding layer.

4. The method according to claim 1, wherein:
the calculation step determines, for each of the layers, the output maximum value of the neurons of each of the layers based on a value obtained by adding Nσ to an average value that is obtained by averaging maximum values of the output values of the neurons included the corresponding layer; and
N is integer, and σ is standard deviation.

5. The method according to claim 1, wherein:
the adjustment step is performed after learning of the multilayer neural network constructed on the computer is performed.

6. The method according to claim 1, wherein:
the analog processing circuit further adds a bias input to which a weight is given when the analog processing circuit performs the addition of the signal weighted by the conductance of the memristor; and
the correction step further corrects the weight for the corresponding bias input by the scaling factor calculated in the calculation step for each of the layers.

7. The method according to claim 1, wherein:
the adjustment step is performed when learning is performed in a multilayer neural network constructed with the memristor and the analog processing circuit;
the analog processing circuit includes
an operational amplifier, and
a feedback resistor that connects an output of the operational amplifier and an inverting input terminal, and determines a degree of amplification by the operational amplifier;
the analog processing circuit includes the memristor as the feedback resistor;
the adjustment step includes
a detection step that detects an output value of the neurons of each of the layers,
a determination step that determines whether the output value of the neuron of each of the layers exceeds a predetermined range upper limit determined based on the write threshold voltage of the memristor, and
a change step that, in the analog processing circuit corresponding to a neuron having an output value exceeding the range upper limit, changes a resistance value of the memristor as the feedback resistor to lower the output value of the neuron to a value equal to or lower than the range upper limit.

8. The method according to claim 7, wherein:
the change step changes the resistance value of the memristor as the feedback resistor in an order from the neuron in a lower layer close to an input layer of the multilayer neural network to the neuron in an upper layer close to an output layer.

9. The method according to claim 8, wherein:
the change step collectively changes the resistance values of the memristors as the feedback resistors included in the analog processing circuit corresponding to the neurons of each of the layers.

10. The method according to claim 7, wherein:
the change step collectively changes the resistance values of the memristors as the feedback resistors included in the analog processing circuit corresponding to the neurons of all the layers.

* * * * *